US009187817B2

(12) United States Patent
Kim (10) Patent No.: US 9,187,817 B2
(45) Date of Patent: Nov. 17, 2015

(54) MASK ASSEMBLY FOR THIN FILM VAPOR DEPOSITION AND MANUFACTURING METHOD THEREOF

(71) Applicant: Samsung Display Co., Ltd., Yongin, Gyeonggi-Do (KR)

(72) Inventor: Yong-Hwan Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/078,008

(22) Filed: Nov. 12, 2013

(65) Prior Publication Data

US 2014/0130735 A1   May 15, 2014

(30) Foreign Application Priority Data

Nov. 15, 2012   (KR) .................. 10-2012-0129596

(51) Int. Cl.
*B05C 11/00*   (2006.01)
*C23C 14/04*   (2006.01)
*H01L 51/00*   (2006.01)

(52) U.S. Cl.
CPC .......... *C23C 14/042* (2013.01); *H01L 51/0011* (2013.01); *Y10T 29/49826* (2015.01)

(58) Field of Classification Search
None
See application file for complete search history.

(56) References Cited

U.S. PATENT DOCUMENTS

2004/0163592 A1*   8/2004   Abiko et al. .................. 118/715
2006/0103289 A1*   5/2006   Kim et al. ..................... 313/402
2011/0146573 A1*   6/2011   Park .............................. 118/712

FOREIGN PATENT DOCUMENTS

| KR | 10-0696523 | 3/2007 |
| KR | 10-2009-0052203 | 5/2009 |
| KR | 10-2009-0123590 | 12/2009 |
| KR | 10-0941311 | 2/2010 |
| KR | 10-2011-0107045 | 9/2011 |

* cited by examiner

*Primary Examiner* — Charles Capozzi
(74) *Attorney, Agent, or Firm* — Robert E. Bushnell, Esq.

(57) ABSTRACT

A mask assembly for a thin film deposition includes: a frame main body forming an opening; a plurality of unit masks having both ends fixed to the frame main body in a state that a tension force is applied in a first direction; and an end tension unit installed to the frame main body. The end tension unit moves according to a second direction crossing the first direction between two neighboring unit masks among a plurality of unit masks for tensioning of the unit mask in the second direction.

7 Claims, 8 Drawing Sheets

MASK ASSEMBLY FOR THIN FILM VAPOR DEPOSITION AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on 15 Nov. 2012 and there duly assigned Serial No. 10-2012-0129596.

BACKGROUND OF THE INVENTION

1. Field of the Invention

An embodiment of the present invention relates generally to a mask assembly, and more particularly, to a mask assembly used in a thin film deposition process such as an organic emission layer or a metal layer, and a manufacturing method thereof.

2. Description of the Related Art

As a flat panel display device, a liquid crystal display (LCD) device and an organic light emitting diode (OLED) display device are widely used. The flat panel display device includes a metal layer of a predetermined pattern, and in a case of the organic light emitting diode (OLED) display device, an organic emission layer of the predetermined pattern is formed for every pixel. A deposition method using a mask assembly as a method of forming the metal layer and the organic emission layer may be applied.

The mask assembly includes a mask having an opening corresponding to the pattern of the metal layer or the organic emission layer and a frame supporting the mask. In a division mask method, the mask is divided into a plurality of unit masks formed with a belt shape, and each unit mask is fixed to the frame by welding in a state that the unit mask is extended in a length direction. The division mask method allows good selection and is easy to repair.

The unit mask is applied with a tension force in one direction such that the unit mask is elongated in the length direction of the tension direction, however, a contraction is generated in a direction crossing the tension direction, that is, a width direction, and thereby the entire mask may be wrinkled. This wrinkle becomes more serious as a width of the unit mask is increased.

Also, both ends of the unit mask are fixed to a clamp to be extended, and in this case, the unit mask is formed of a thin metal plate such that the wrinkle may be generated about the ends fixed to the clamp when the unit mask is capable of enduring a pulling force by the clamp. The wrinkle that is generated at the ends of the unit mask is expanded to the center of the unit mask in which an opening is positioned thereby generating a deposition defect.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of the present invention provides a mask assembly that increases deposition quality of a thin film by suppressing a winkle generated in a unit mask and a manufacturing method thereof for the mask assembly of a division mask method.

A mask assembly according to an embodiment includes: a frame main body forming an opening; a plurality of unit masks having both ends fixed to the frame main body in a state that a tension force is applied in a first direction; and an end tension unit installed to the frame main body and moving according to a second direction crossing the first direction between two neighboring unit masks among a plurality of unit masks to cause a tension of the unit mask in the second direction.

One end tension unit may be provided between two neighboring unit masks. The frame main body may form a plurality of concave grooves to install the end tension unit, and the ends of the unit mask may be fixed to a surface of the frame main body between the concave grooves.

The end tension unit may include: a guide rail formed parallel to the second direction at a bottom of the concave groove; a moving member coupled to the guide rail and sliding according to the second direction; and a moving controller coupled to the moving member and controlling a moving direction and a moving amount of the moving member. A width of the moving member may be smaller than a width of the concave groove, and a surface of the moving member may be maintained with the same height of a surface of the frame main body.

The moving controller may include a rack coupling unit installed to a side wall of the moving member and including a rack, and a driving axle including a pinion engaged with the rack. The moving controller may include a guide coupling unit installed to the side wall of the concave groove. The guide coupling unit may be surface-contacted with the rack coupling unit according to the second direction to guide the movement of the rack coupling unit.

The first direction may accord with a length direction of the unit mask, and the second direction may accord with a width direction of the unit mask.

A manufacturing method of a mask assembly according to an embodiment includes: providing a frame main body installed with a plurality of unit masks having ends formed with an extension and a plurality of end tension units; performing tensioning of one unit mask among a plurality of unit masks in a first direction and fixing both ends of the unit mask to a surface of the frame main body; fixing the extension to a moving member of the end tension unit; moving the moving member according to a second direction crossing the first direction for the tensioning of the ends of the unit mask in the second direction; and separating and removing the extension from the unit mask.

The extension may be provided in a pair for each end of the unit mask and may be protruded outside the unit mask according to the second direction. The frame main body may form a plurality of concave grooves, the end tension unit may be respectively installed to each of the plurality of concave grooves, and each concave groove may correspond to a space between a plurality of unit masks one by one.

The end tension unit may include: a guide rail formed in parallel to the second direction at a bottom of the concave groove; a moving member coupled to the guide rail and sliding according to the second direction; and a moving controller coupled to the moving member and controlling a moving direction and a moving amount of the moving member.

A width of the moving member may be smaller than a width of the concave groove, and the surface of the moving member may be maintained with the same height as the surface of the frame main body. The moving controller may include a rack coupling unit installed to a side wall of the moving member and including a rack, and a driving axle including a pinion engaged with the rack.

The moving member may become farther away from the unit mask when the moving member is moved according to the second direction. A plurality of unit masks may include a first unit mask and a second unit mask, the second unit mask may be fixed beside the first unit mask after the first unit mask is fixed to the frame main body, and one end tension unit may be sequentially fixed to the extension of the first unit mask and the extension of the second unit mask.

The first direction may accord with a length direction of the unit mask, and the second direction may accord with a width direction of the unit mask.

The unit mask having the wrinkle generated by the tension of the first direction is expanded in the second direction thereby effectively removing the wrinkle of the unit mask. Accordingly, the deformation of the pattern opening of the unit mask by the wrinkle may be suppressed, thereby improving the deposition quality of the thin film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Unless explicitly described to the contrary, the word "comprise" and variations such as "comprises" and "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. Throughout this specification, it is understood that the term "on" and similar terms are used generally and are not necessarily related to a gravitational reference.

Figure 1:
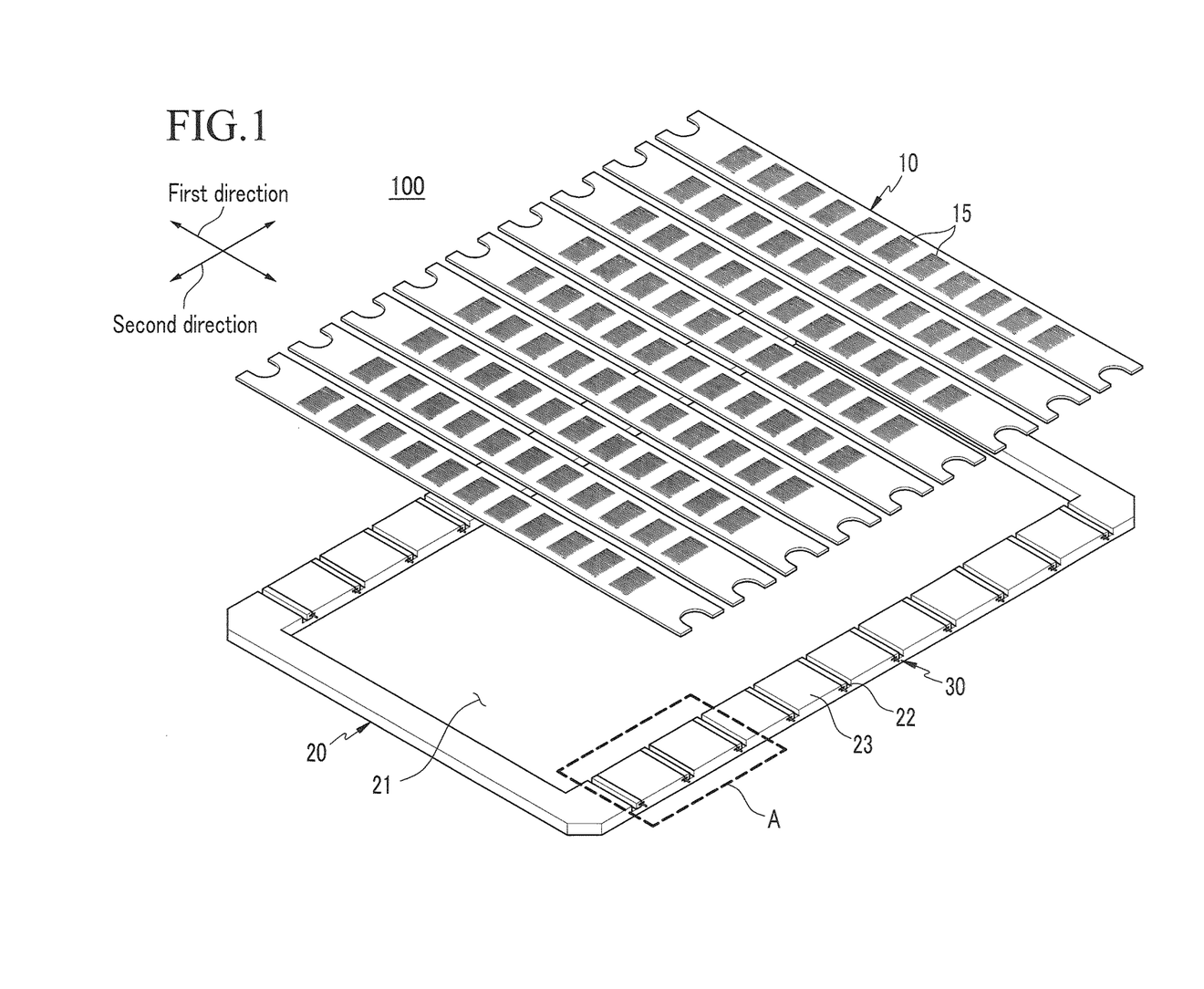
FIG. 1 is an exploded perspective view of a mask assembly according to an embodiment of the present invention.
Figure 2:
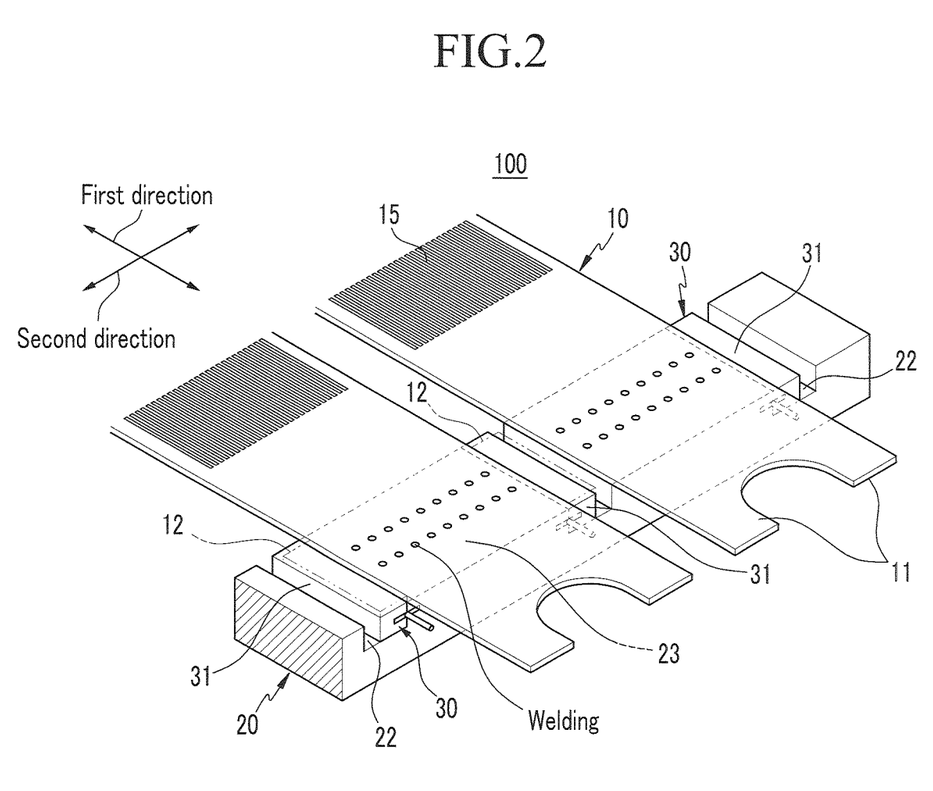
FIG. 2 is an enlarged view of a portion A of FIG. 1.

FIG. 1 is an exploded perspective view of a mask assembly according to an embodiment of the present invention, and FIG. 2 is an enlarged view of a portion A of FIG. 1.

In reference to FIG. 1 and FIG. 2, a mask assembly 100 according to the present embodiment of the present invention includes a plurality of unit masks 10, a frame main body 20 supporting the plurality of unit masks 10, and a plurality of end tension units 30 provided in the frame main body 20.

Each unit mask 10 has a predetermined length and a predetermined width and has a belt shape. In FIG. 1 and FIG. 2, a length direction of the unit mask 10 is indicated by the first direction, and a width direction of the unit mask 10 is indicated by the second direction. Each unit mask 10 is supported by the frame main body 20 while both ends are fixed to the frame main body 20 by welding in a state that a tension force is applied according to the first direction.

The plurality of unit masks 10 are disposed in parallel on the frame main body 20 according to the second direction while having a predetermined distance therebetween. The ends of each unit mask 10 may include a pair of protruding portions 11 to be coupled to a clamp (not shown) applying the tension force to the unit mask 10.

Each unit mask 10 includes a plurality of pattern openings 15. The plurality of pattern openings 15 are positioned in parallel according to the first direction with a predetermined distance therebetween. Each pattern opening 15 is made of a plurality of minute openings, and each minute opening is formed with the same shape as the thin film to be deposited. Accordingly, in the deposition process, a deposition material is deposited on the substrate through the pattern opening to form the thin film (an organic emission layer or a metal layer etc.) with a desired shape.

One pattern opening 15 may correspond to one flat panel display device (e.g., an organic light emitting diode (OLED) display device). In this case, patterns corresponding to a plurality of flat panel displays may be simultaneously deposited through a single process using one mask assembly 100. That is, the mask assembly 100 corresponds to one mother substrate, and the patterns corresponding to a plurality of flat panel displays may be simultaneously formed on the mother substrate.

The frame main body 20 is formed of a rectangular frame shape in which an opening 21 is formed at a center thereof. Two edges of the frame main body 20 contacted with the unit mask 10 are parallel to the second direction, and the other two edges are parallel to the first direction. The pattern openings 15 formed at a plurality of unit masks 10 through the opening 21 of the frame main body 20 are exposed.

As a plurality of unit masks 10 applied with the tension force are fixed to the frame main body 20, the frame main body 20 is acted on by a compression force according to the first direction as a tension direction of the unit mask 10. The frame main body 20 may be manufactured of a metal material having large rigidity such as stainless steel to not be deformed by the compression force.

A plurality of end tension units 30 are installed to two edges of the frame main body 20 to which the ends of the unit mask 10 are fixed and are positioned with the distance therebetween according to the second direction. Each end tension unit 30 includes a moving member 31 that moves according to the second direction in a determined space.

The tension force is only applied in the first direction in the unit mask 10 such that contraction is generated in the second direction thereby easily causing a wrinkle. The end tension unit 30 is temporarily fixed with the end of the unit mask 10, and the end of the unit mask 10 is extended according to the second direction thereby removing the wrinkle generated in the unit mask 10.

In detail, each unit mask 10 includes an extension 12 (indicated by a dotted line in FIG. 2) fixed to the moving member 31, and the extension 12 is removed from the unit mask 10 after the wrinkle removal according to the tension of the second direction. A process of removing the wrinkle of the unit mask 10 by using the extension 12 and the end tension unit 30 will be described in detail in a manufacturing method of the mask assembly 100 later.

The end tension unit 30 is positioned at both sides (a right side and a left side) of each unit mask 10. At this time, the two neighboring unit masks 10 may be sequentially fixed to one end tension unit 30 such that one end tension unit 30 is positioned between two neighboring two unit masks 10.

Accordingly, a plurality of end tension units 30 are positioned corresponding to the spaces between a plurality of unit masks 10 and an outer space of the outermost unit mask 10. That is, when a number of the unit masks 10 is n, n+1 end tension units 30 are provided at one edge of the frame main body 20. By positioning one end tension unit 30 between two neighboring unit masks 10, an unnecessary space expansion may be minimized and an interval between the unit masks 10 may be reduced.

The frame main body 20 forms a plurality of concave grooves 22 to install the end tension unit 30 and is fixed with the unit mask 10 by welding at a surface 23 in which the concave groove 22 is not formed.

Figure 3:
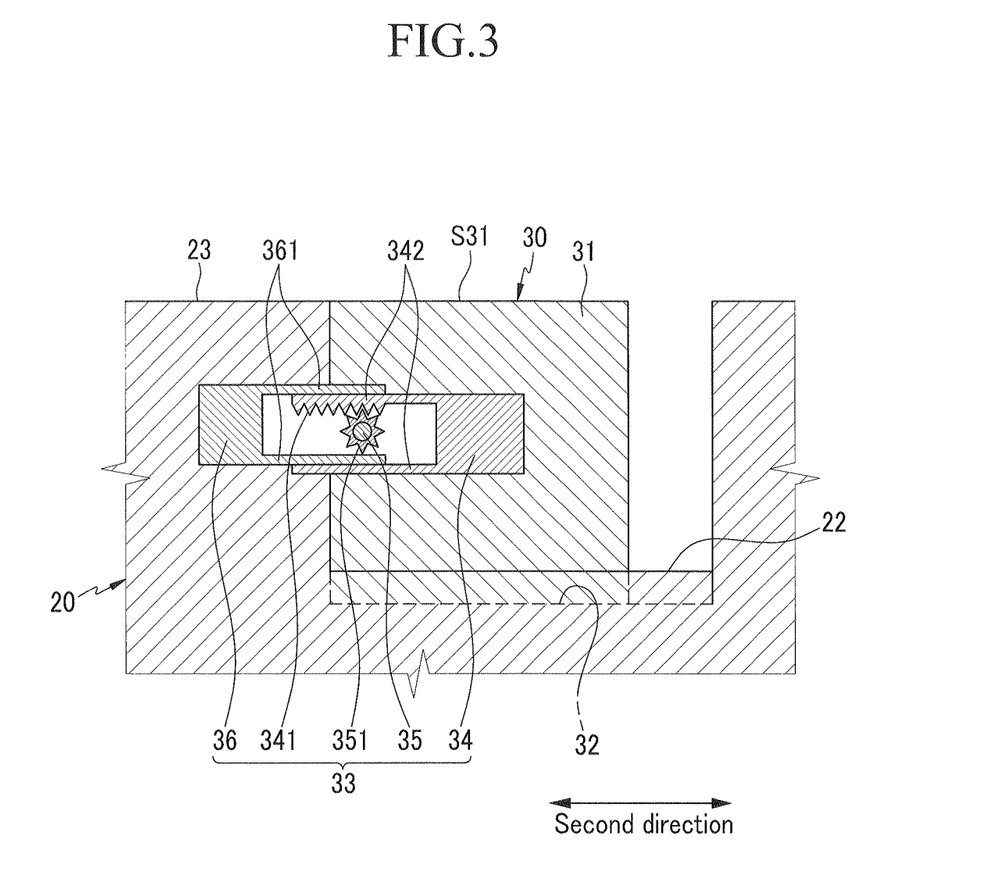
FIG. 3 is a cross-sectional view of an end tension unit shown in FIG. 2.
Figure 4:
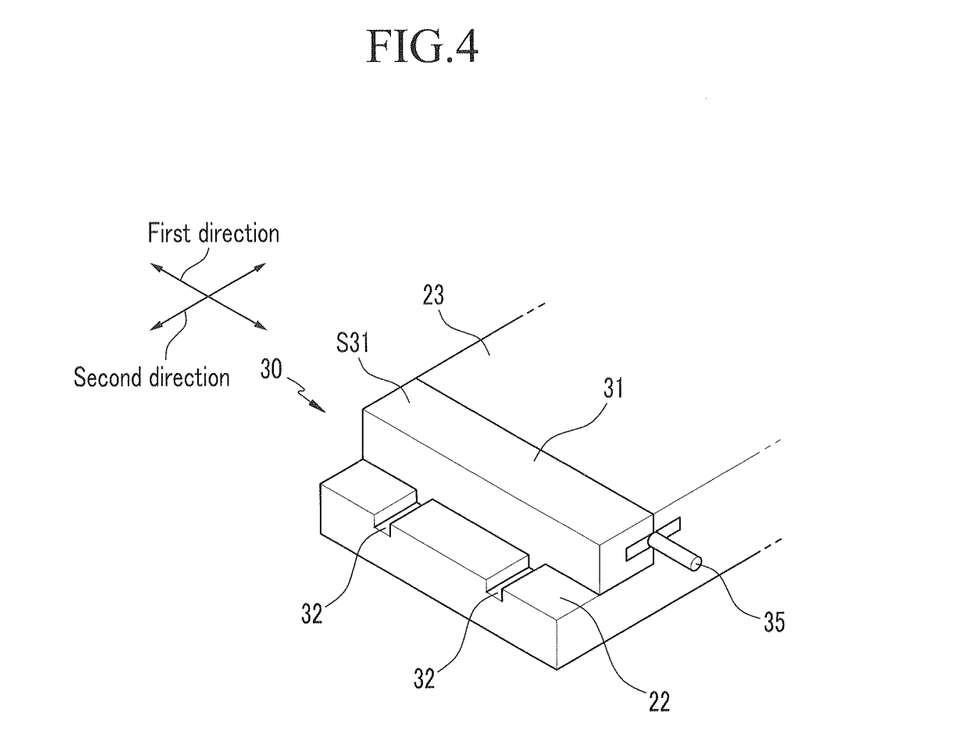
FIG. 4 is a partially perspective view of an end tension unit shown in FIG. 2.

FIG. 3 is a cross-sectional view of an end tension unit shown in FIG. 2, and FIG. 4 is a partially perspective view of an end tension unit shown in FIG. 2.

In reference to FIG. 3 and FIG. 4, the end tension unit 30 includes a guide rail 32 formed at the concave groove 22, a moving member 31 coupled to the guide rail 32, and a moving controller 33 controlling a motion of the moving member 31.

The guide rail 32 is formed parallel to the second direction in a bottom of the concave groove 22 and is provided with a groove or protrusion shape. In FIG. 3, two guide rails 32 formed with the groove are formed at the bottom of the concave groove 22, however the number and the shape of the guide rail 32 are not limited to the shown example.

The moving member 31 is coupled to the guide rail 32 and slides according to the second direction in the concave groove 22. The moving member 31 may have a coupling structure of the guide rail 32 and the protrusion-groove. The width of the moving member 31 is smaller than the width of the concave groove 22 such that the moving member 31 is moved left and right in the concave groove 22. Also, the surface S31 of the moving member 31 is maintained with the same height as the surface 23 of the frame main body 20.

The moving controller 33 is coupled to the moving member 31 to control the motion of the moving member 31 according to the second direction. The moving controller 33 is installed at a side wall of the moving member 31 and may include a rack coupling unit 34 including a rack 341 and a driving axle 35 including a pinion 351 engaged with the rack 341. The driving axle 35 is positioned between one side wall of the concave groove 22 and the moving member 31 and is coupled to an external power source (not shown) to be rotated while being supported by the frame main body 20.

With reference to FIG. 3, if the driving axle 35 is rotated in a clockwise direction, the rack coupling unit 34 is pushed from the side wall of the concave groove 22 and the moving member 31 is moved to the right side. In contrast, if the driving axle 35 is rotated in a counterclockwise direction, the rack coupling unit 34 is pulled toward the side wall of the concave groove 22 and the moving member 31 is moved to the left side. A movement amount of the moving member 31 is proportional to a rotation amount of the driving axle 35. The moving direction and the moving amount of the moving member 31 may be minutely controlled according to the rotation direction and the rotation amount of the driving axle 35.

The moving controller 33 may further include a guide coupling unit 36 installed at the side wall of the concave groove 22. The guide coupling unit 36 is surface-contacted with the rack coupling unit 34 according to the second direction thereby guiding the movement of the rack coupling unit 34. For example, the rack coupling unit 34 may include at least one first horizontal part 342 protruded toward the driving axle 35, and the guide coupling unit 36 may include at least one second horizontal part 361 surface-contacted with the first horizontal part 342 according to the second direction.

The first horizontal part 342 and the second horizontal part 361 may be respectively provided in a pair. In this case, a rack 341 may be formed inside at least one first horizontal part 342. Also, one second horizontal part 361 of a pair of second horizontal parts 361 is surface-contacted with the first horizontal part 342 outside the first horizontal part 342, and the other second horizontal part 361 is surface-contacted with the first horizontal part 342 inside the first horizontal part 342.

The constitutions of the moving controller 33 are not limited to the above-described example, and configurations capable of sliding the moving member 31 inside the concave groove 22 according to the second direction are applicable.

Next, a manufacturing method of the mask assembly 100 will be described.

Figure 5:
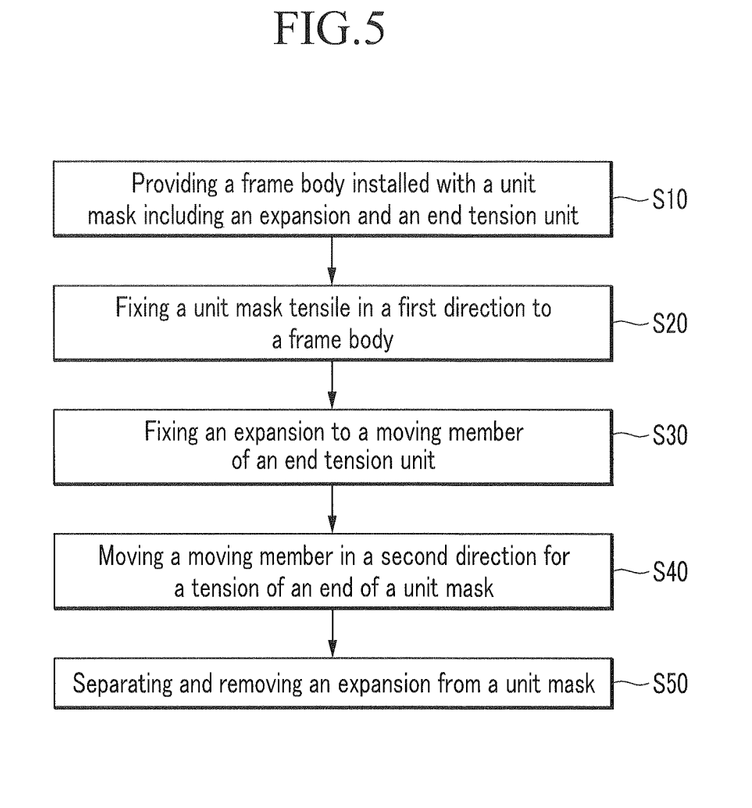
FIG. 5 is a process flowchart of a manufacturing method of a mask assembly according to an embodiment of the present invention.

FIG. 5 is a process flowchart of a manufacturing method of a mask assembly according to an embodiment of the present invention.

In reference to FIG. 5, a manufacturing method of a mask assembly includes a first step S10 providing a frame main body in which a plurality of unit masks including an extension formed at an end and a plurality of end tension units are installed, a second step S20 tensioning one unit mask in the first direction and fixing both ends of the unit mask to the surface of the frame main body, and a third step S30 fixing the extension to the moving member of the end tension unit.

Also, the manufacturing method of the mask assembly includes a fourth step S40 moving the moving member according to the second direction crossing the first direction for the tension of the ends of the unit mask in the second direction and a fifth step S50 separating and removing the extension from the unit mask. The wrinkle may be generated at the unit mask in the tension process of the second step S20, and the wrinkle of the unit mask generated at this time may be removed in the tension process of the fourth step S40.

One unit mask is fixed to the frame main body through the second step S20 to the fifth step S50, and the other unit mask is fixed to the frame main body beside the fixed unit mask through the second step S20 to the fifth step S50. That is, while the second step S20 to the fifth step S50 are repeated for each unit mask, a plurality of unit masks are fixed to the frame main body.

Figure 6:
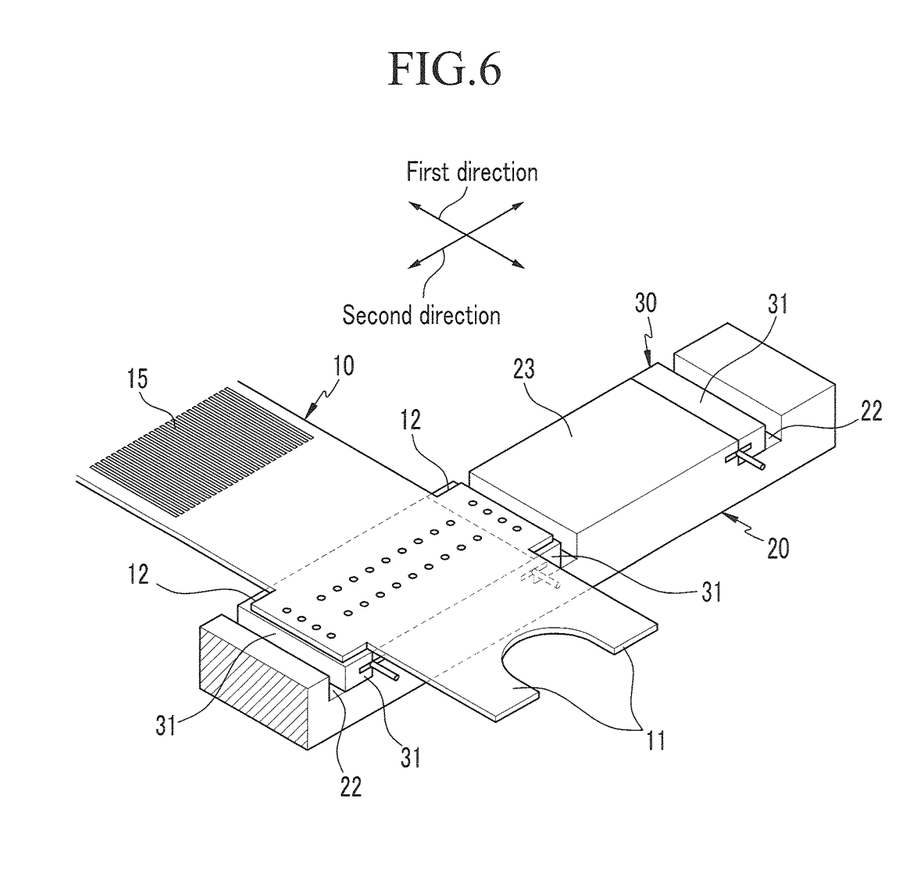
FIG. 6 is a partially perspective view of a mask assembly in the first step to the third step shown in FIG. 5.

FIG. 6 is a partially perspective view of a mask assembly in the first step to the third step shown in FIG. 5.

In reference to FIG. 6, in the first step S10, the unit mask 10 forms a pair of protruding portions 11 and a pair of extensions 12. The pair of protruding portions 11 are protruded outside the unit mask 10 according to the first direction, and the pair of extensions 12 are protruded outside the unit mask 10 according to the second direction. Also, in the first step S10, a plurality of end tension units 30 are installed at the frame main body 20. The position and the detailed structure of the end tension unit 30 are the same as in the above description such that it is not described in further detail.

In the second step S20, a pair of protruding portions 11 are coupled to a clamp (not shown), and the unit mask 10 is tensioned in the first direction by an external force applied from the clamp. The unit mask 10 that is tensioned in the first direction is fixed to the surface 23 of the frame main body 20 by welding.

In this process, the unit mask 10 receives the tension force in only one direction such that the contraction is generated in a direction crossing the tension direction, that is, the second direction, thereby generating the wrinkle on the entire unit mask 10. Also, since the unit mask 10 is formed of a thin metal plate, wrinkles may be generated about the protruding portion 11 by a force that is caused by pulling by the clamp.

In the third step S30, the extension 12 is fixed to the moving member 31 of the end tension unit 30 by the welding. At this time, the moving member 31 is positioned closest to the unit mask 10 in the concave groove 22. That is, the moving controller 33 may determine the position of the moving member 31 for the distance between one side wall of the concave groove 22 toward the unit mask 10 and the moving member 31 to be a minimum.

Figure 7:
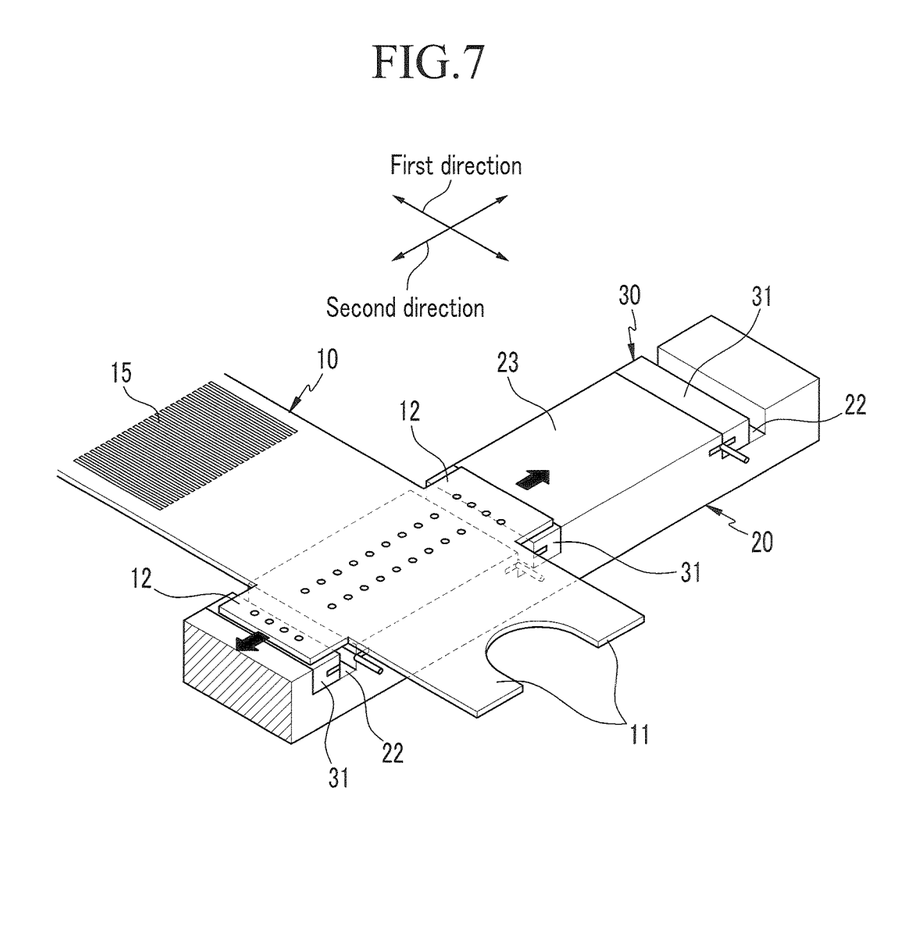
FIG. 7 is a partially perspective view of a mask assembly in the fourth step shown in FIG. 5.

FIG. 7 is a partially perspective view of a mask assembly in the fourth step shown in FIG. 5.

In reference to FIG. 7, in the fourth step S40, the moving member 31 slides according to the second direction to cause the tension of the ends of the unit mask 10 in the second direction. Accordingly, the wrinkle of the unit mask 10 generated in the second step S20 is removed.

Based on the constitution of the moving controller 33 shown in FIG. 3, for the moving member 31 positioned at the right side of the unit mask with reference to FIG. 7, the driving axle 35 is rotated in the clockwise direction to move the moving member 31 to the right side. In contrast, for the moving member 31 positioned at the left side of the unit mask, the driving axle 35 is rotated in the counterclockwise direction to move the moving member 31 to the left side.

As described above, two moving members 31 positioned at the left and right sides of the unit mask 10 slide in the directions that are away from each other to cause the tension of the ends of the unit mask 10 in the second direction. The moving direction and the moving amount of the moving member 31 may be minutely controlled according to the rotation direction and the rotation amount of the driving axle 35 such that the tension force of the unit mask 10 for the wrinkle removal may be minutely controlled.

Figure 8:
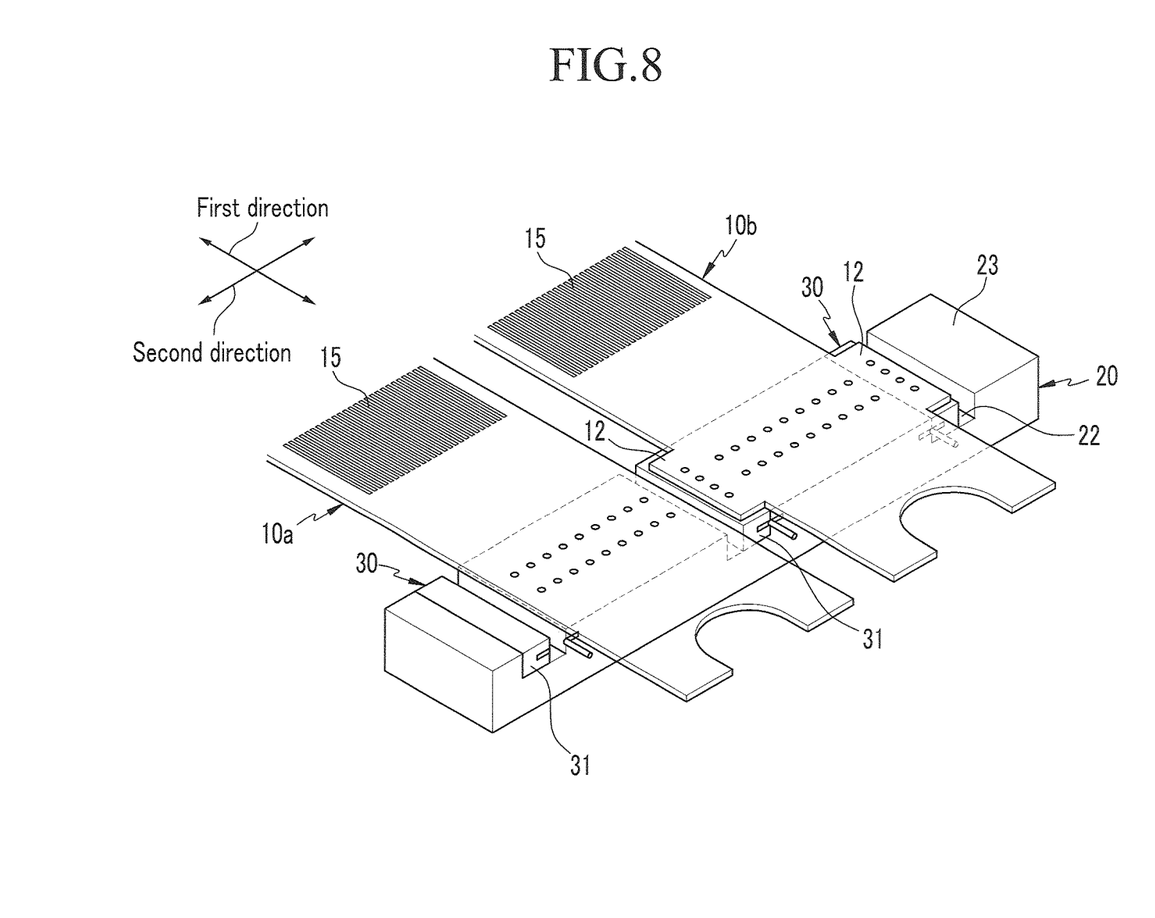
FIG. 8 is a partially perspective view of a mask assembly in the fifth step shown in FIG. 5.

FIG. 8 is a partially perspective view of a mask assembly of the fifth step shown in FIG. 5.

In reference to FIG. 8, in the fifth step S50, the extension 12 is separated and removed from the unit mask 10a. One unit mask 10a is fixed to the frame main body 20 without the wrinkle through the second step S20 to the fifth step S50. Next, the other unit mask 10b is provided beside the fixed unit mask 10a and is fixed to the frame main body 20 while the second step S20 to the fifth step S50 are repeated.

For convenience, the unit mask that is firstly fixed is referred to as a first unit mask 10a, and the unit mask that is fixed later is referred to as a second unit mask 10b. The moving member 31 used for the tension of the first unit mask 10a is coupled to the extension 12 of the second unit mask 10b to be used for the tension of the ends of the second unit mask 10b.

Accordingly, one end tension unit 30 may be positioned between two neighboring unit masks 10a and 10b. As a result, a space occupied with the end tension unit 30 in the frame main body 20 is minimized such that the unnecessary extension of the interval between the unit masks 10a and 10b may be prevented by the end tension unit 30. Also, a number of patterns capable of being formed in one mother substrate may be increased by increasing a number of the pattern openings 15 provided in one mask assembly 100.

As described above, the mask assembly 100 according to the present exemplary embodiment provides the tension in the second direction to the unit mask 10 having the wrinkle due to the tension in the first direction thereby effectively removing the wrinkles. Accordingly, a deformation of the pattern opening 15 of the unit mask 10 by the wrinkle is suppressed, thereby improving the deposition quality of the thin film.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 100: mask assembly | 10: unit mask |
| 20: frame main body | 22: concave groove |
| 30: end tension unit | 31: moving member |
| 32: guide rail | 33: moving controller |

What is claimed is:

1. A mask assembly, comprising:
   a frame main body forming an opening;
   a plurality of unit masks having both ends fixed to two opposite edges of the frame main body in a state that a tension force is applied in a first direction; and
   an end tension unit installed exclusively at the two opposite edges of the frame main body to which the plurality of unit masks are fixed and moving according to a second direction crossing the first direction between two neighboring unit masks among the plurality of unit masks to cause a tension of each of the unit masks in the second direction,
   wherein one end tension unit is provided between the two neighboring unit masks.

2. The mask assembly of claim 1, wherein
   the frame main body provides a plurality of concave grooves to install the end tension unit, and
   the both ends of each of the unit masks are fixed to a surface of the frame main body between the concave grooves.

3. The mask assembly of claim 2, wherein
   the end tension unit includes:
   a guide rail formed parallel to the second direction at a bottom of each of the concave grooves;
   a moving member coupled to the guide rail and sliding according to the second direction; and
   a controller coupled to the moving member and controlling a moving direction and an amount of the movement of the moving member.

4. The mask assembly of claim 3, wherein
   a width of the moving member is smaller than a width of each of the concave grooves, and
   a surface of the moving member is maintained with a same height of the surface of the frame main body.

5. The mask assembly of claim 3, wherein
   the controller includes:
   a rack coupling unit installed to a side wall of the moving member and including a rack; and
   a driving axle including a pinion engaged with the rack.

6. The mask assembly of claim 5, wherein
   the controller includes a guide coupling unit installed to a side wall of each of the concave grooves, and the guide coupling unit is surface-contacted with the rack coupling unit according to the second direction to guide the moving of the rack coupling unit.

7. The mask assembly of claim 1, wherein the first direction accords with a length direction of each of the unit masks, and the second direction accords with a width direction of each of the unit masks.

\* \* \* \* \*